United States Patent [19]
Gershenson et al.

[11] Patent Number: 5,387,864
[45] Date of Patent: Feb. 7, 1995

[54] CHANNEL EQUALIZED DC SQUID FLUX-LOCKED LOOP

[75] Inventors: Meir Gershenson, Panama City; Robert J. McDonald, Panama City Beach, both of Fla.

[73] Assignee: The United States of America as represented by the Secretary of the Navy, Washington, D.C.

[21] Appl. No.: 95,557

[22] Filed: Jul. 26, 1993

[51] Int. Cl.⁶ .................. G01R 33/035; H01L 39/24
[52] U.S. Cl. .................... 324/248; 505/846; 327/527
[58] Field of Search ............ 324/248; 505/845, 846; 307/306

[56] References Cited

U.S. PATENT DOCUMENTS

| | | |
|---|---|---|
| 4,004,217 | 1/1977 | Giffard . |
| 4,389,612 | 6/1983 | Simmonds et al. ............... 324/248 |
| 4,509,018 | 4/1985 | Gershenson ....................... 307/306 |
| 4,549,135 | 10/1985 | Vaidya ............................... 324/248 |
| 5,027,069 | 6/1991 | Roehrlein . |
| 5,095,270 | 3/1992 | Ludeke . |

OTHER PUBLICATIONS

Clark, "Principles and Applications of SQUIDs" Proc IEEE, Aug. 1989.

Gershenson, Meir, et al, "High Slew Rate 'Channel Equalized' DC SQUID Flux Locked Loop", presented Aug. 24, 1992 at 1992 Applied Superconductivity Conference.

Primary Examiner—Sandra L. O'Shea
Assistant Examiner—Roger C. Phillips
Attorney, Agent, or Firm—William C. Townsend; Edward J. Connors, Jr.; Kenneth W. Dobyns

[57] ABSTRACT

A DC superconductor quantum interference device (i.e. DC SQUID) is used in a flux-locked loop as a sensitive detector of magnetic flux. Prior art devices of this sort had a transfer function which was frequency-limited by the transfer function of impedance matching circuitry which is used to connect the DC SQUID with the first preamplifier, which amplifies the DC SQUID signal before it is applied to a detector circuit. The present invention corrects this frequency limitation by creating a compensating circuit having a transfer function which is the inverse of that of the impedance matching circuitry, and inserting it in the system after the first preamplifier and before the detector circuit.

2 Claims, 3 Drawing Sheets

OPEN-LOOP GAIN VERSUS FREQUENCY FOR COMPENSATED AND UNCOMPENSATED FLL DESIGNS

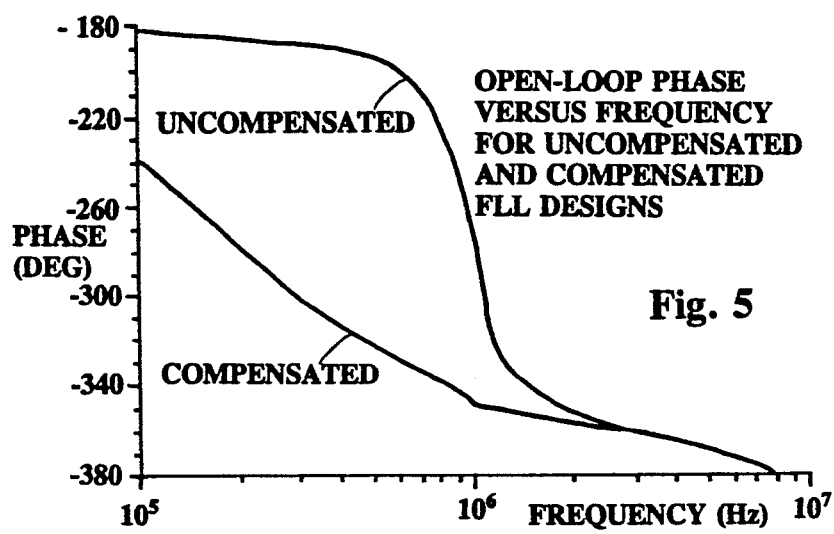
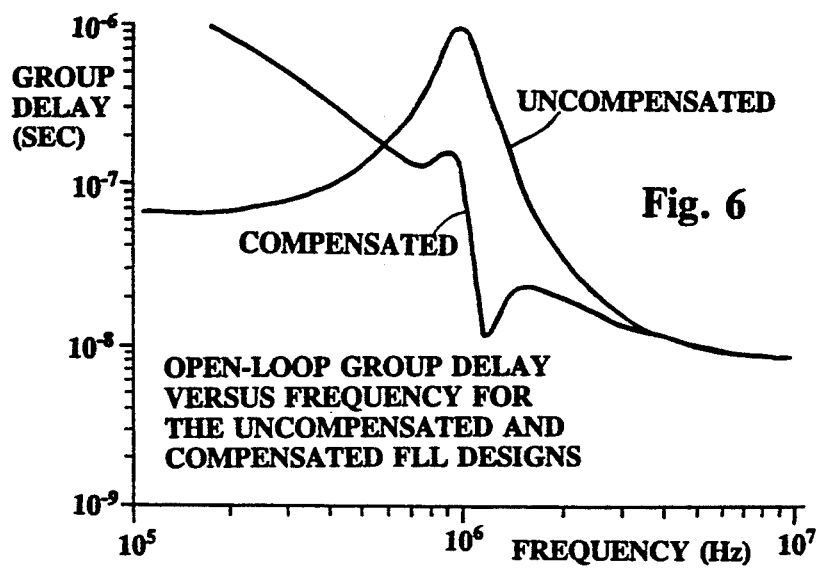
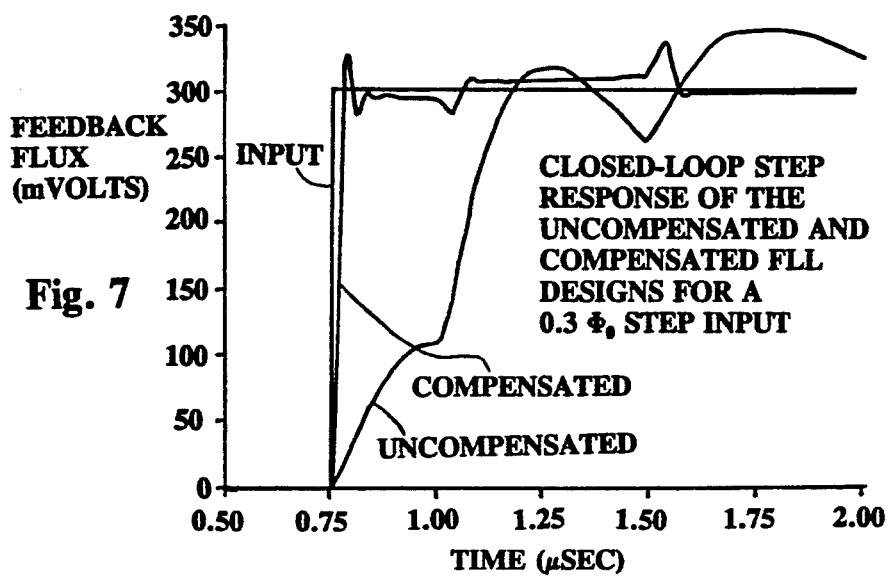

CHANNEL EQUALIZED DC SQUID FLUX-LOCKED LOOP

BACKGROUND OF THE INVENTION

Superconducting quantum interference devices (SQUIDs) are very sensitive detectors of magnetic flux. It is known to use a DC SQUID in a flux-locked loop as a null detector of magnetic flux. Typically a DC SQUID is exposed to a flux to be detected, and is simultaneously modulated with an alternating flux of some reference frequency. If there is no flux to be detected, the output signal from the DC SQUID resulting from the modulating flux contains only a signal of twice the reference frequency. If, however, there is flux to be detected, the DC SQUID output signal approaches closer to the reference frequency, with the polarity of the output signal varying with the polarity of the flux to be detected. A lock-in detector at the reference frequency and phase will provide an output voltage proportional in amplitude and equal in polarity to the flux to be detected. Locking of the detector reference frequency to the frequency and phase of the modulation flux results in a flux-locked loop.

If a square-wave modulation and demodulation process is employed, then the following equations hold:

for the modulation process, $s_m(t) = s_s(t) \times m(t)$ for the demodulation process, $s_d(t) = s_m(t) \times M(t)$ where $s_s(t)$ is the DC SQUID output signal, $s_m(t)$ is the modulated signal, $m(t)$ is a square wave modulating signal, $s_d(t)$ is the detected signal, and $M(t)$ is the demodulation signal proportional to M(t).

Because $M(t) \times m(t)$ is a constant, the detected signal is proportional to the output signal of the DC SQUID. In the conventional approach, the modulated signal is distorted and the original signal cannot be reconstructed completely.

Because the DC SQUID, operated at 4.2 degrees Kelvin, has a low output resistance (typically a few ohms) and since the input resistance of the room temperature operated pre-amplifier is on the order of several thousand ohms, some form of impedance matching is necessary. Typically, the impedance matching is accomplished via a coldside transformer or resonant LC circuit. In addition, these impedance matching networks also provide a limited amount of signal gain, so as to improve the signal-to-noise ratio associated with the transmission line used to couple the signal from the DC SQUID to the warmside preamplifier. However, the use of these impedance matching networks severely limits the bandwidth of the DC SQUID flux-locked loop (FLL).

SUMMARY OF THE INVENTION

We have found it advantageous to strategically place a phase and amplitude equalization circuit in a DC SQUID flux-locked loop, which, when thus constructed, we refer to as a "channel-equalized DC SQUID FLL". This increases the operating bandwidth of the loop and hence its slew rate over that of a conventionally designed FLL. Thus, the equalization circuit, for a given modulation frequency, produces a DC SQUID FLL with an improved immunity to spurious unlocking in robust radio frequency (RF) environments.

BRIEF DESCRIPTION OF THE DRAWINGS

FIG. 5 is a graph showing an approximation of the open-loop phase response of the uncompensated and compensated FLL designs plotted against frequency.

FIG. 6 is a graph showing an approximation of the open-loop group delay of the uncompensated and compensated FLL designs plotted against frequency.

FIG. 7 is a graph showing the closed-loop step response of the uncompensated and compensated FLL systems for a 0.3 $\Phi_o$ step input, where $\Phi_o$ is one flux quantum.

DESCRIPTION OF THE PREFERRED EMBODIMENT

Figure 1:
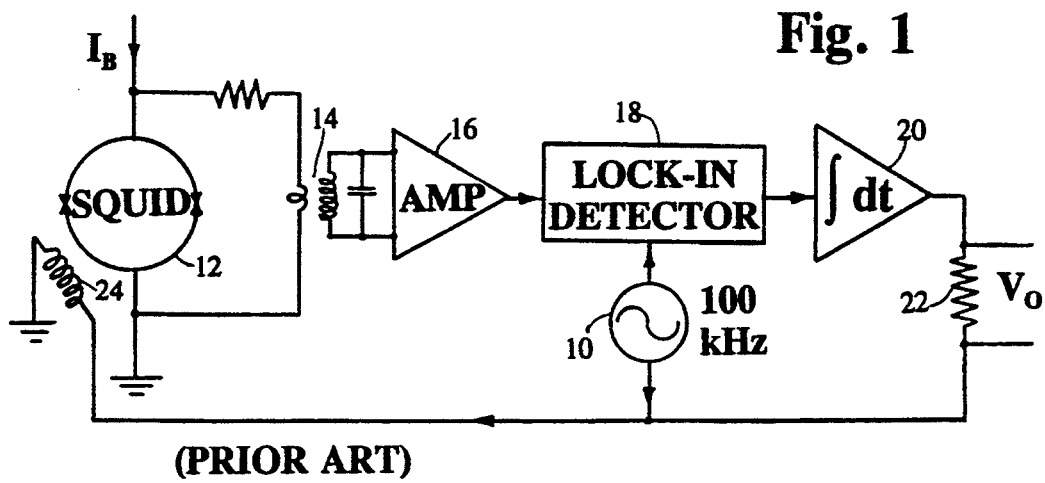
FIG. 1 is a schematic block diagram of a DC SQUID FLL in accordance with the prior art.

FIG. 1 is a schematic block diagram of a DC SQUID FLL in accordance with the prior art. See "Principles and Applications of SQUIDs" by John Clarke in *Proceedings of the IEEE*, August 1989. In this prior art system, a 100 kHz oscillator 10 supplies a modulating flux to a DC SQUID 12, which is kept on the cold side of the equipment at about 4.2 degrees Kelvin. The signal from the DC SQUID is applied to the primary coil of a transformer 14, and from the secondary of the transformer the signal is applied to the input of a preamplifier 16, which is on the warm side of the equipment (at room temperature). The amplified signal from pre-amplifier 16 is applied to a lock-in detector circuit 18, which is also supplied with a version of the 100 kHz signal from oscillator 10. The lock-in detected signal is then sent to an integrator 20 for low-pass filtering. The resulting filtered signal is provided across a resistor 22 as the output $V_o$ of the system, representative of the ambient flux through the DC SQUID, and is also provided by feedback to a modulation and feedback coil 24, which controls the modulation of the ambient flux through the DC SQUID. This is all thoroughly explained in John Clarke's cited article.

Figure 2:
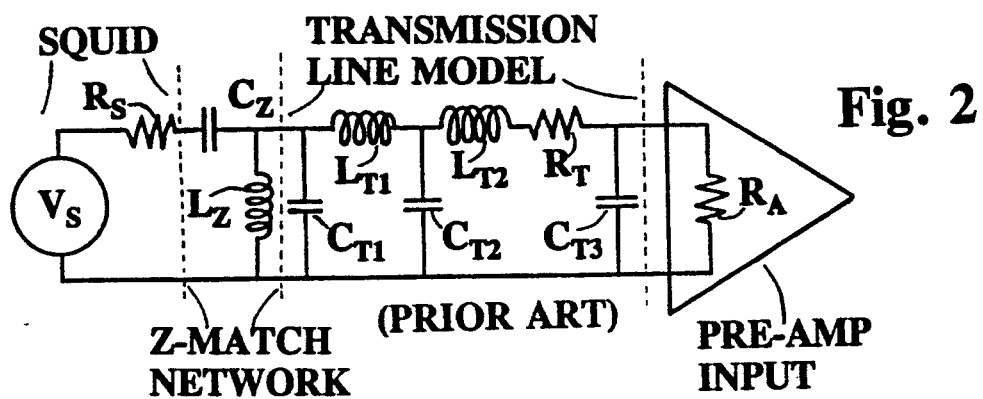
FIG. 2 is a representation of the lumped-element equivalent network for the portion of the prior art circuit from the DC SQUID to the preamplifier.

FIG. 2 is an equivalent circuit, showing an approximation of the frequency-affecting tangible and intrinsic components between the DC SQUID and the preamplifier, which affect the frequency response of the system. In this equivalent circuit, $R_S$ represents the intrinsic dynamic resistance of the DC SQUID (approximately 2 to 10 ohms, depending on the DC SQUID). $C_Z$ and $L_Z$ represent the values of tangible components used in the impedance-matching network, which are chosen to be resonant at the modulation frequency. $C_{T1}$, $L_{T1}$, $C_{T2}$, $L_{T2}$, $R_T$, and $C_{T3}$ represent the intrinsic values inherently present in the transmission line connected to the input of the preamplifier. $R_A$ represents the intrinsic resistance across the input of the preamplifier. These, and other impedances of a lesser order of magnitude which are ignored here, combine to affect the transfer function as to frequency between the DC SQUID and the preamplifier, and therefore the frequency response of the system.

Figure 3:
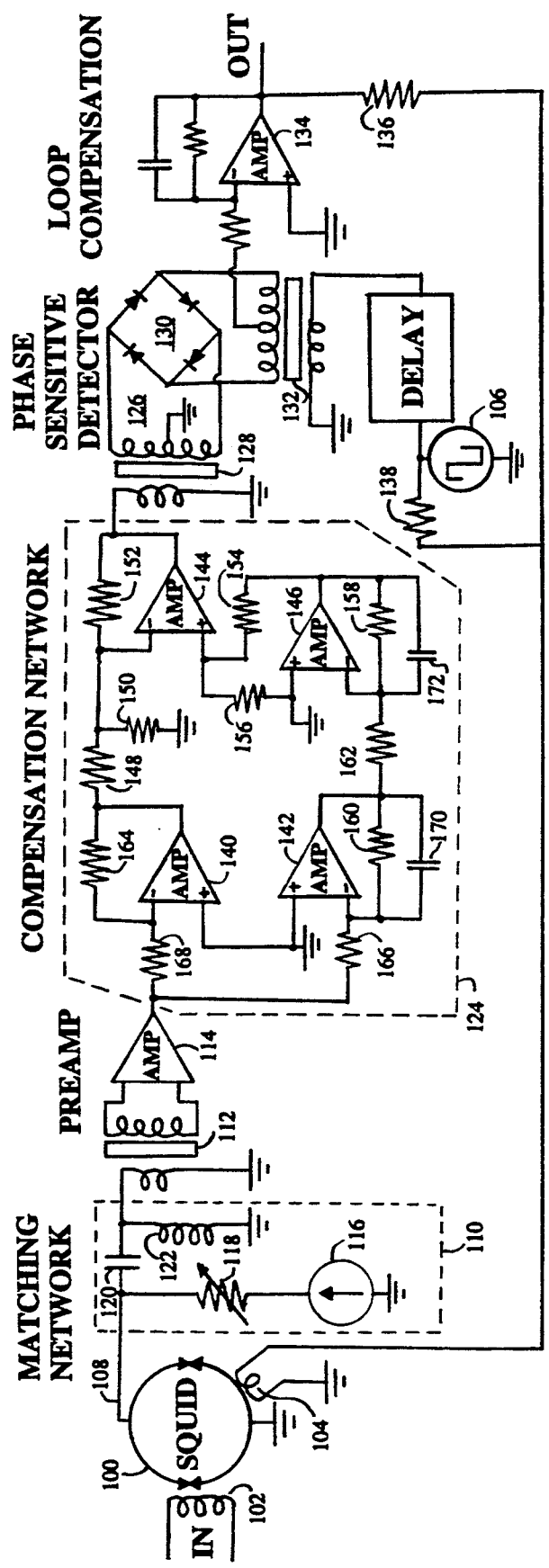
FIG. 3 is a schematic block diagram of a channel-equalized DC SQUID FLL, compensated in accordance with one embodiment of the invention.

FIG. 3 is a schematic block diagram of a channel-equalized DC SQUID flux-locked loop according to the present invention. A DC SQUID 100 is positioned to be affected by magnetic flux from an input coil 102, although in practice it is more likely be affected by flux from some ambient source which it was desired to measure. An alternating reference flux is applied through coil 104, as excited by square wave generator 106. The resulting DC SQUID output current on line 108 represents some function of the square wave frequency from generator 106 modulated by some function of the magnetic flux from coil 104. This output current is applied to an impedance matching circuit 110 before application through a warmside transformer 112 to a preamplifier 114. Within the matching network, a constant current source 116 of about 100 $\mu$A applies a current through a variable resistance 118 to drive the DC SQUID 100. In the matching network, capacitor 120 and coil 122 complete the impedance matching.

We have added a compensation network 124 between preamplifier 114 and phase sensitive detector 126. The output of the compensation network is fed to the input coil of a transformer 128, the output coil of which connects to a full-wave rectifier 130. The output of the rectifier 130 is fed to one coil of a transformer 132, which is also center tapped to provide an input to one input of an integrating loop compensation amplifier 134. The output of amplifier 134 provides the system output, and is also summed through a resistor 136 with the output from square-wave generator 106 provided through a resistor 138 to form the excitation current for reference flux coil 104.

The various circuitry between the DC SQUID 100 and the input of amplifier 114 has a frequency transfer function H($\omega$), which is nonlinear with respect to frequency, as was explained in connection with FIG. 2. The object of the compensation network 124 is to introduce another frequency transfer function K($\omega$) which is a bandlimited inverse of H($\omega$), that is to say H($\omega$)=1/K($\omega$) over a finite range of frequency. It will almost always be impossible to create one circuit which has exactly the inverse frequency transfer function of another, but the closer the approximation, the closer the overall frequency transfer function of the FLL will be to linearity. In other words the bandwidth of the input channel to the demodulator will be increased. Hence, the compensated signal will have a greater resemblance to the original signal applied to the input of the DC SQUID, and in particular, this effect will be enhanced if one uses a square-wave modulation and demodulation process. Correction of distortion through the use of compensation circuits is not uncommon in communications systems, but appears to be new in the field of DC SQUID FLL systems.

It is impossible to specify one set of values for the compensation network without knowing what has to be compensated. One set of values for one set of conditions was presented in our paper "High Slew Rate Channel Equalized DC SQUID Flux-Locked Loop: Concept and Stimulation" presented on Aug. 24, 1992 at the 1992 Applied Superconductivity Conference in Chicago, and submitted for publication in the Conference Papers of that Conference. Under the set of conditions used in a simulator for that paper, amplifiers 140, 142, 144, and 146 were differential operational amplifiers, resistors 148, 150, 152, 154, and 156 are 10K$\Omega$, resistors 158 and 160 are 560$\Omega$, resistor 162 is 100$\Omega$, resistor 164 is 1032$\Omega$, resistor 166 is 160$\Omega$, and resistor 168 is 1060$\Omega$, and capacitors 170 and 172 are each 1.61 nanoFarads.

The compensation network 124 shown in FIG. 3 implements a band-limited approximation to the inverse transfer function of the impedance matching network 110, as it is more clearly shown in FIG. 2. Operational amplifiers 142 and 146, with their associated impedances, provide a second order (expressed in terms of s) integrator transfer function in the form $k/(s+s_o)^2$. A constant gain factor is provided by operational amplifier 140 and its associated impedances, and operational amplifier 144 provides a weighted sum of the outputs from amplifiers 140 and 146. This does not provide the optimal value of the inverse transfer function of the input impedance, but merely a fairly good approximation. If desired, a more accurate approximation could be provided by using a more complicated network, providing a weighted sum of zero, first, and second order integrators. If needed, a 30 MHz low-pass filter would be placed immediately after the compensation circuit to limit the loop gain at high frequencies. However, the filter would not often be needed, because the frequency dependence of the ordinary operational amplifiers would accomplish the same purpose.

A series of simulations were run of the responses of a compensated and uncompensated DC SQUID FLL. In this simulation, the effect of the intrinsic impedances of the transmission line were not considered, and the impedance of the LC matching network was the only impedance considered as H($\omega$), or compensated for by the inverse impedance K($\omega$) represented by the compensation network. The transmission line impedances were considered to have lesser effect on the frequency response than the impedance of the LC matching network, and therefore to be of lesser importance. The results of these simulations are shown in FIGS. 4-7.

Figure 4:
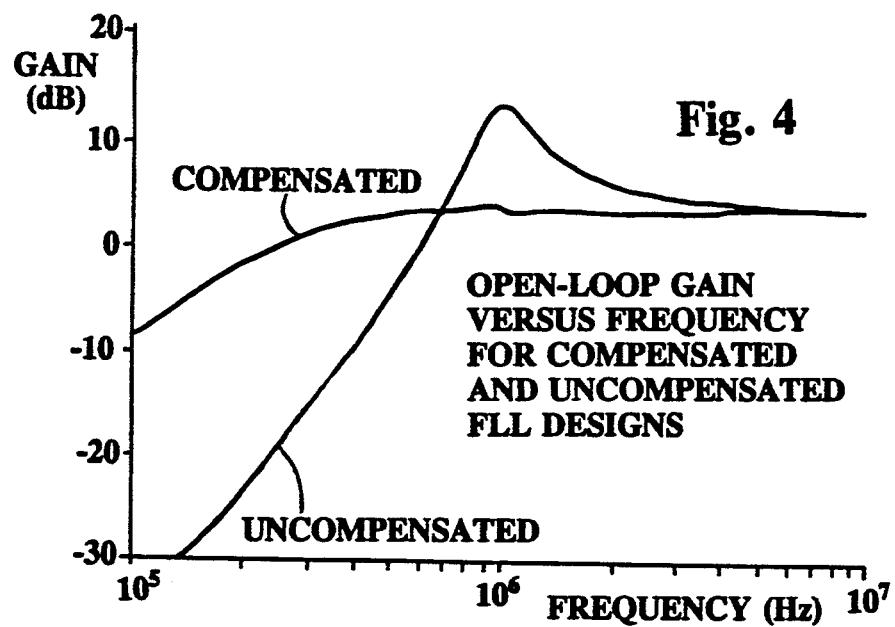
FIG. 4 is a graph showing an approximation of the open-loop gain for the uncompensated and compensated FLL designs plotted against frequency.

FIG. 4 shows plots of the circuit gain versus frequency for both compensated and uncompensated systems. Clearly the compensated system has a much wider and flatter amplitude response. The phase change in the vicinity of the modulation frequency is also important, and FIG. 5 compares the compensated and uncompensated open-loop phase responses as a function of frequency. The phase of the compensated system in the vicinity of the modulation frequency is much more linear than that of the uncompensated system. FIG. 6 shows the open-loop group delay (derivative of the phase) for compensated and uncompensated systems as a function of frequency. Introduction of the compensation network reduces the group delay beyond the modulation frequency for several MHz. The improvement in the FLL frequency response implies a corresponding improvement in the time-domain performance. FIG. 7 illustrates a closed-loop response to a step input signal for both the compensated and uncompensated version of the system. The gain for both systems was set to yield approximately the same percent overshoot when a 0.3 $\Phi_o$ step is applied to the DC SQUID input. This was done to allow the two systems to be compared on an equal basis. Clearly, for approximately the same percentage overshoot, the compensated system has a much faster response.

What is claimed is:

1. In a direct current superconducting quantum interference device (DC SQUID) flux-locked loop system comprising A. said DC SQUID operated in a cold region and subjected to some flux which is to be measured and to a modulating flux,
B. an amplifier operated in a warm region,
C. impedance matching circuitry arranged to connect an electrical output from the DC SQUID to an electrical input of the amplifier,
D. a phase-sensitive detector responsive to an electrical output from the amplifier, and
E. loop-compensation circuitry for providing an output signal indicative of the flux which is to be measured and for providing feedback to maintain the system in a flux-locked loop, the improvement comprising a compensation network having a frequency transfer function which is the inverse of the frequency transfer function of the impedance matching circuitry, said compensation network being situated in the system between the output of the amplifier and the phase-sensitive detector, whereby both the frequency-domain response and the time-domain response of the system are made more nearly linear.

2. A method for frequency compensating a direct current superconducting quantum interference device (DC SQUID) flux-locked loop system having as components said DC SQUID operated in a cold region and subjected to some flux which is to be measured and to a modulating flux, an amplifier operated in a warm region, impedance matching circuitry arranged to connect an electrical output from the DC SQUID to an electrical input of the amplifier, a phase-sensitive detector responsive to an electrical output from the amplifier, and loop-compensation circuitry for providing an output signal indicative of the flux which to be measured and for providing feedback to maintain the system in a flux-locked loop, said method comprising the steps of
A. determining the frequency transfer function of the impedance matching circuitry,
B. providing a compensation network having a frequency transfer function which is the inverse of the frequency transfer function of the impedance matching circuitry, and
C. placing said compensation network in the system between the output of the amplifier and the phase-sensitive detector, thereby making the response of the system more nearly linear, both in the frequency-domain and in the time-domain.

* * * * *